(12) United States Patent
Kim et al.

(10) Patent No.: US 8,507,944 B2
(45) Date of Patent: Aug. 13, 2013

(54) LIGHT EMITTING DEVICE, METHOD OF FABRICATING THE SAME AND LIGHT EMITTING DEVICE PACKAGE

(75) Inventors: Sung Kyoon Kim, Seoul (KR); Hee Young Beom, Seoul (KR); Sung Ho Choo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/114,246

(22) Filed: May 24, 2011

(65) Prior Publication Data

US 2011/0284901 A1    Nov. 24, 2011

(30) Foreign Application Priority Data

May 24, 2010  (KR) .................. 10-2010-0047833

(51) Int. Cl.
*H01L 33/00*    (2010.01)
(52) U.S. Cl.
USPC  257/103; 257/79; 257/E33.025; 257/E33.03; 257/E33.028
(58) Field of Classification Search
USPC .......... 257/98, 99, 103, 79, E33.025, E33.03, 257/E33.028
See application file for complete search history.

(56) References Cited

U.S. PATENT DOCUMENTS

| 7,151,281 | B2 | 12/2006 | Shei et al. | ....................... 257/79 |
| 2008/0136347 | A1 | 6/2008 | Lin et al. | |
| 2010/0032691 | A1 | 2/2010 | Kim | |

FOREIGN PATENT DOCUMENTS

| JP | 2007-294963 A | 11/2007 |
| KR | 10-2005-0060739 A | 6/2005 |
| KR | 10-2006-0117210 A | 11/2006 |
| KR | 10-2008-0092716 A | 10/2008 |
| KR | 10-2010-0016901 A | 2/2010 |
| WO | WO 2009/015386 A1 | 1/2009 |

OTHER PUBLICATIONS

Korean Office Action dated Dec. 8, 2010 issued in Application No. 10-2010-0047833.

*Primary Examiner* — Julio J Maldonado
*Assistant Examiner* — Amar Movva
(74) *Attorney, Agent, or Firm* — KED & Associates, LLP (57) ABSTRACT

Disclosed herein is a light emitting device including a first nitride semiconductor and a second nitride semiconductor, each of which includes a first conductivity-type semiconductor layer, an active layer and a second conductivity-type semiconductor layer, and a connection layer formed between the second conductivity-type semiconductor layer of the second nitride semiconductor and the first conductivity-type semiconductor layer of the first nitride semiconductor, wherein the first nitride semiconductor and the second nitride semiconductor are connected by the connection layer, and the light emitting device further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor. The light emitting device may be driven and emit light using AC power.

23 Claims, 8 Drawing Sheets

LIGHT EMITTING DEVICE, METHOD OF FABRICATING THE SAME AND LIGHT EMITTING DEVICE PACKAGE

This application claims the benefit of Korean Patent Application No. 10-2010-0047833, filed on May 24, 2010, which is hereby incorporated in its entirety by reference as if fully set forth herein.

BACKGROUND

1. Field

The present embodiment relates to a light emitting device, a method of fabricating the same and a light emitting device package.

2. Discussion of the Related Art

Light emitting devices, such as light emitting diodes or laser diodes using group III-V or II-VI compound semiconductor materials, produce light of various colors, such as red, green, blue, and ultraviolet light, due to development of thin film growth techniques and element materials, and produce white light using fluorescent materials or through color mixing. Further, the light emitting devices have advantages, such as low power consumption, semi-permanent lifespan, rapid response speed, safety, and environmentally friendliness as compared to conventional light sources, such as fluorescent lamps and incandescent lamps.

Therefore, these light emitting devices are increasingly applied to transmission modules of optical communication units, light emitting diode backlights replacing cold cathode fluorescent lamps (CCFLs) constituting backlights of liquid crystal display (LCD) devices, lighting apparatuses using white light emitting diodes replacing fluorescent lamps or incandescent lamps, headlights for vehicles and traffic lights.

SUMMARY

Accordingly, the present embodiment is directed to a light emitting device, a method of fabricating the same and a light emitting device package.

An object of the present embodiment is to provide a light emitting device which is driven and emits light using AC power.

Additional advantages, objects, and features of the embodiment will be set forth in part in the description which follows and in part will become apparent to those having ordinary skill in the art upon examination of the following or may be learned from practice of the embodiment. The objectives and other advantages of the embodiment may be realized and attained by the structure particularly pointed out in the written description and claims hereof as well as the appended drawings.

To achieve this object and other advantages and in accordance with the purpose of the embodiment, as embodied and broadly described herein, a light emitting device includes a first nitride semiconductor and a second nitride semiconductor, each of which includes a first conductivity-type semiconductor layer, a second conductivity-type semiconductor layer and an active layer disposed between the first conductivity-type semiconductor layer and the second conductivity-type semiconductor layer, and a connection layer formed between the second conductivity-type semiconductor layer of the second nitride semiconductor and the first conductivity-type semiconductor layer of the first nitride semiconductor, wherein the first nitride semiconductor and the second nitride semiconductor are connected by the connection layer, and the light emitting device further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor.

In another aspect of the present embodiment, a light emitting device package includes a package body, a first electrode layer and a second electrode layer disposed on the package body and electrically isolated from each other, and a light emitting device electrically connected to the first electrode layer and the second electrode layer, wherein the light emitting device includes a first nitride semiconductor and a second nitride semiconductor, each of which includes a first conductivity-type semiconductor layer, a second conductivity-type semiconductor layer and an active layer disposed between the first conductivity-type semiconductor layer and the second conductivity-type semiconductor layer, and a connection layer formed between the second conductivity-type semiconductor layer of the second nitride semiconductor and the first conductivity-type semiconductor layer of the first nitride semiconductor, wherein the first nitride semiconductor and the second nitride semiconductor are connected by the connection layer, and the light emitting device package further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor.

In another aspect of the present embodiment, a lighting system includes light emitting device packages, each of which includes at least one light emitting device, a circuit board electrically connected to the light emitting device packages, a substrate to support the light emitting device packages and the circuit board, and optical members to transmit light emitted from the light emitting device packages, wherein the at least one light emitting device includes a first nitride semiconductor and a second nitride semiconductor, each of which includes a first conductivity-type semiconductor layer, a second conductivity-type semiconductor layer and an active layer disposed between the first conductivity-type semiconductor layer and the second conductivity-type semiconductor layer, and a connection layer formed between the second conductivity-type semiconductor layer of the second nitride semiconductor and the first conductivity-type semiconductor layer of the first nitride semiconductor, wherein the first nitride semiconductor and the second nitride semiconductor are connected by the connection layer, and the lighting system further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor.

It is to be understood that both the foregoing general description and the following detailed description of the present embodiment are exemplary and explanatory and are intended to provide further explanation of the embodiment as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENT

Hereinafter, a light emitting device, a method of fabricating the same and a light emitting device package in accordance with present embodiments will be described with reference to the accompanying drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the drawings, the thicknesses or sizes of respective layers are exaggerated, omitted, or schematically illustrated for convenience and clarity of description. Further, the sizes of the respective elements do not denote the actual sizes thereof.

FIGS. 1A to 1H are views illustrating a method of fabricating a light emitting device in accordance with one embodiment. Hereinafter, the method of fabricating a light emitting device will be described with reference to FIG. 1A to 1H.

Figure 1A:
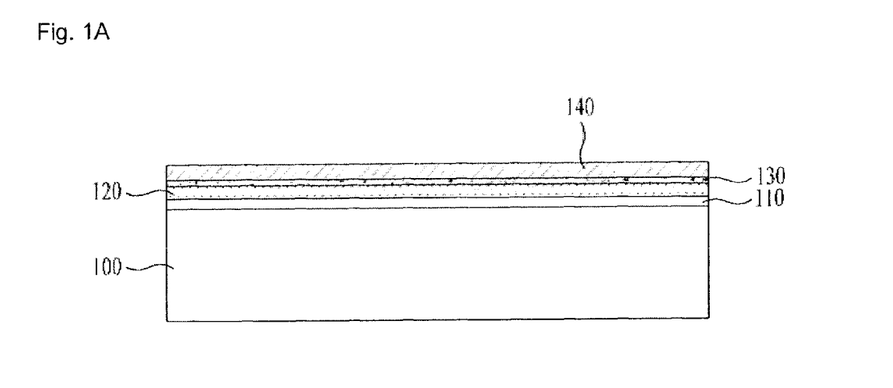
FIGS. 1A to 1H are views illustrating a method of fabricating a light emitting device in accordance with one embodiment of the present embodiment.

First, in FIG. 1A, a first nitride semiconductor is formed on a substrate 100. Here, the first nitride semiconductor may include a first conductivity-type semiconductor layer 120, an active layer 130 and a second conductivity-type semiconductor layer 140. The active layer 130 disposed between the first conductivity-type semiconductor layer 120 and the second conductivity-type semiconductor layer 140.

For example, as the support substrate 100, a sapphire ($Al_2O_3$) substrate, a silicon carbide (SiC) substrate, a silicon (Si) substrate, or a gallium arsenide (GaAs) substrate may be used. Preferably, as the support substrate 100, a sapphire ($Al_2O_3$) substrate is used.

A buffer layer 110 serves to reduce lattice mismatch and differences in coefficients of thermal expansion between the support substrate 100 and the nitride semiconductor material. For example, the buffer layer 110 may be formed of at least one selected from among the group consisting of GaN, AlN, InN, InGaN, AlGaN, InAlGaN and AlInN.

The buffer layer 110, the first conductivity-type semiconductor layer 120, the active layer 130 and the second conductivity-type semiconductor layer 140 may be formed through metal organic chemical vapor deposition (MOCVD), chemical vapor deposition (CVD), plasma-enhanced chemical vapor deposition (PECVD), molecular beam epitaxy (MBE), and hydride vapor phase epitaxy (HVPE), but formation thereof is not limited thereto.

Further, the first conductivity-type semiconductor layer 120, the active layer 130 and the second conductivity-type semiconductor layer 140 may be formed at a temperature of 700~1,100° C.

The first conductivity-type semiconductor layer 120 may include a group III-V compound semiconductor doped with a first conductivity-type dopant. If the first conductivity-type semiconductor layer 120 is an N-type semiconductor layer, the first conductivity-type dopant is an N-type dopant, and the N-type dopant may include Si, Ge, Sn, Se and Te, but is not limited thereto.

The first conductivity-type semiconductor layer 120 may include an N-doped semiconductor material having a composition formula of $Al_xIn_yGa_{1-x-y}N$ ($0 \leq x \leq 1$, $0 \leq y \leq 1$, $0 \leq x+y \leq 1$). For example, the first conductivity-type semiconductor layer 120 may include at least one selected from among the group consisting of GaN, InN, AlN, InGaN, AlGaN, InAlGaN, AlInN, AlGaAs, InGaAs, AlInGaAs, GaP, AlGaP, InGaP, AlInGaP and InP.

The first conductivity-type semiconductor layer 120 may be formed by injecting silane ($SiH_4$) gas including an N-type impurity, such as trimethyl gallium (TMGa) gas, ammonia ($NH_3$) gas, nitrogen ($N_2$) gas or silicon (Si), into a chamber.

The active layer 130 emits light having energy decided by an inherent energy band of an active layer (light emitting) layer due to contact between carriers injected through the first conductivity-type semiconductor layer 120 and the second conductivity-type semiconductor layer 140.

The active layer 130 may be formed to have at least one selected from among the group consisting of a single quantum well structure, a multi-quantum well structure (MQW), a quantum-wire structure and a quantum dot structure. For example, the active layer 130 may be formed to have an MQW structure by injecting trimethyl gallium (TMGa) gas, ammonia ($NH_3$) gas, nitrogen ($N_2$) gas or trimethyl indium (TMIn) gas, but is not limited thereto.

Well/barrier layers of the active layer 130 may be formed to have at least one paired structure selected from among the group consisting of InGaN/GaN, InGaN/InGaN, GaN/AlGaN, InAlGaN/GaN, GaAs(InGaAs)/AlGaAs and GaP(InGaP)/AlGaP, but are not limited thereto. The well layer may be formed of a material having a lower band gap than the band gap of the barrier layer.

The second conductivity-type semiconductor layer 140 may include a group III-V compound semiconductor doped with a second conductivity-type dopant, for example, a semiconductor material having a composition formula of $In_xAl_yGa_{1-x-y}N$ ($0 \leq x \leq 1$, $0 \leq y \leq 1$, $0 \leq x+y \leq 1$). If the second conductivity-type semiconductor layer 140 is a P-type semiconductor layer, the second conductivity-type dopant is a P-type dopant, and the P-type dopant may include Mg, Zn, Ca, Sr and Ba.

The second conductivity-type semiconductor layer 140 may be a P-type GaN layer formed by injecting biscetyl cyclo pentadienyl magnesium (($EtCp_2Mg$){$Mg(C_2H_5C_5H_4)_2$}) including a P-type impurity, such as trimethyl gallium (TMGa) gas, ammonia ($NH_3$) gas, nitrogen ($N_2$) gas or magnesium (Mg), into a chamber, but is not limited thereto.

In this embodiment, the first conductivity-type semiconductor layer 120 may be a P-type semiconductor layer and the second conductivity-type semiconductor layer 140 may be an N-type semiconductor layer. Further, a semiconductor layer having polarity opposite to the second conductivity-type semiconductor layer 140, for example, an N-type semiconductor layer (not shown) if the second conductivity-type semiconductor layer 140 is a P-type semiconductor layer, may be formed on the second conductivity-type semiconductor layer 140.

Figure 1B:
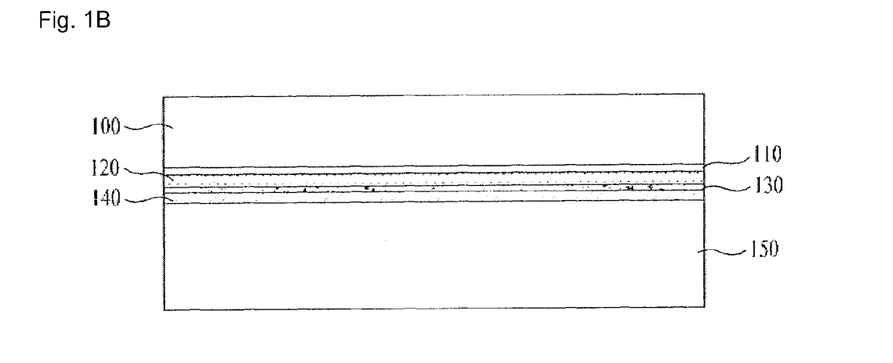

Thereafter, in FIG. 1B, a first substrate 150 is formed on the second conductivity-type semiconductor layer 140. Here, the first substrate 150 serves to support the first nitride semiconductor after removal of the support substrate 100, which will be described later. If the first substrate 150 is formed of a conductive material, the first substrate 150 may be formed of at least one metal selected from among the group consisting of silicon (Si), chrome (Cr), molybdenum (Mo), nickel (Ni), gold (Au), aluminum (Al), titanium (Ti), platinum (Pt), copper (Cu) and tungsten (W), or alloys thereof.

Further, the first substrate 150 may be formed to a thickness of 30-500 μm.

Figure 1C:
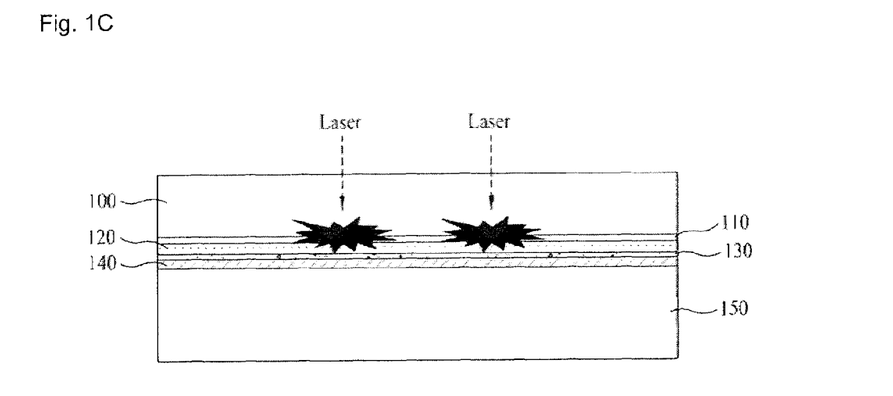

Thereafter, in FIG. 1C, the support substrate 100 and the buffer layer 110 are removed. Here, the removal of the support substrate 100 may be achieved by laser lift-off (LLO) using an excimer laser, dry etching or wet etching.

Here, if the removal of the support substrate 100 is achieved by LLO, when a laser having energy smaller than the energy band gap of the support substrate 100 and greater than the energy band gap of the first conductivity-type semiconductor layer 120 is irradiated, the buffer layer 110 absorbs the laser and thus separation of the support substrate 100 is carried out.

Figure 1D:
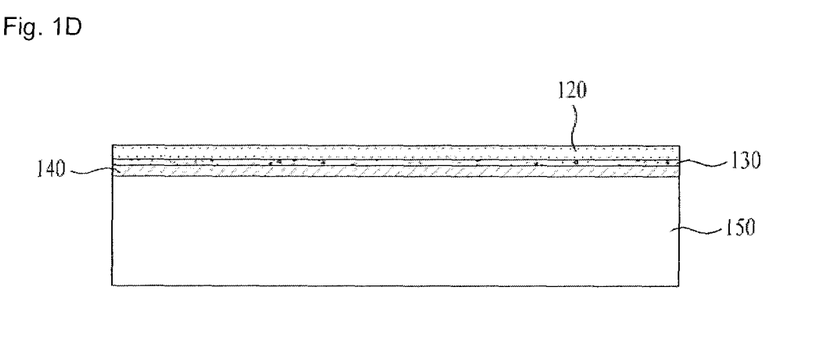

FIG. 1D illustrates the first substrate 150 on which the second conductivity-type semiconductor layer 140, the active layer 130 and the first conductivity-type semiconductor layer 120 are stacked by removing the support substrate 100 and the buffer layer 110.

Figure 1E:
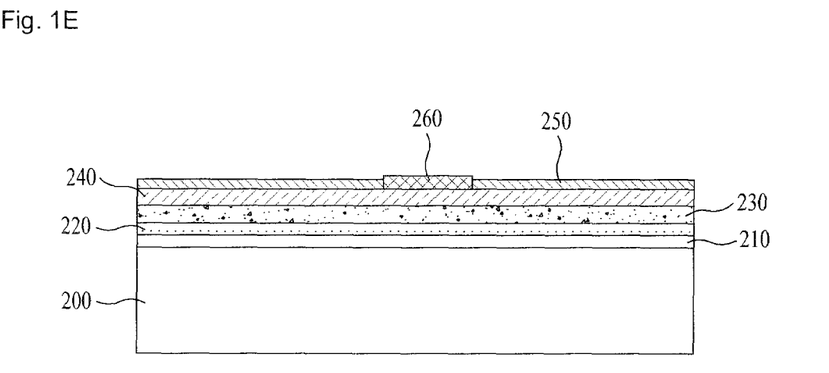

Thereafter, in FIG. 1E, another nitride semiconductor structure is formed. That is, a second nitride semiconductor is formed on a second substrate 200. Here, the second nitride semiconductor may include a first conductivity-type semiconductor layer 220, an active layer 230 and a second conductivity-type semiconductor layer 240.

Compositions and methods of forming the respective layers of the second nitride semiconductor are the same as those of the above-described first nitride semiconductor.

Thereafter, a connection layer 250 is formed on the second conductivity-type semiconductor layer 240 of the second nitride semiconductor. The connection layer 250 serves to connect the second nitride semiconductor to the first nitride semiconductor.

Further, a current blocking layer (CBL) 260 may be formed within the connection layer 250 by patterning. That is, in order to relieve current crowding of a light emitting device which will be fabricated, the current blocking layer 260 may be formed of a metal or an insulating material. If the current blocking layer 260 is formed of a metal, a layer of the first nitride semiconductor or the second nitride semiconductor to which current is supplied may be formed of the material forming the layer and a material having Schottky characteristics.

Figure 1F:
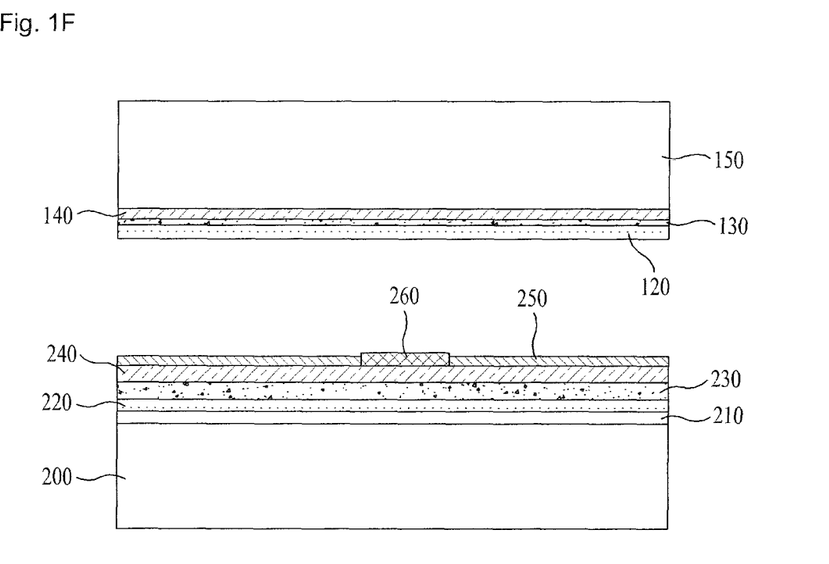

Thereafter, in FIG. 1F, the first nitride semiconductor of FIG. 1D and the second nitride semiconductor are bonded. Here, the first nitride semiconductor is bonded to the second nitride semiconductor through the connection layer 250 formed on the second nitride semiconductor.

Figure 1G:
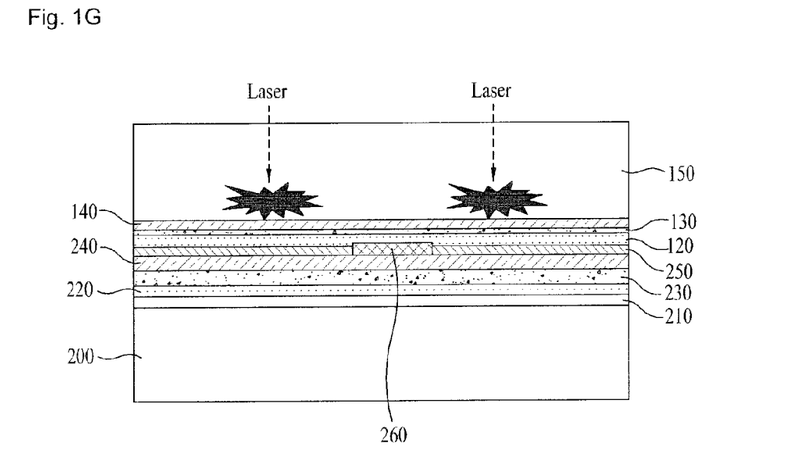

Thereafter, in FIG. 1G, the first substrate 150 to which the first nitride semiconductor is fixed is removed. Here, the removal of the first substrate 150 may be carried out by the same method as that of the removal of the support substrate 100.

Figure 1H:
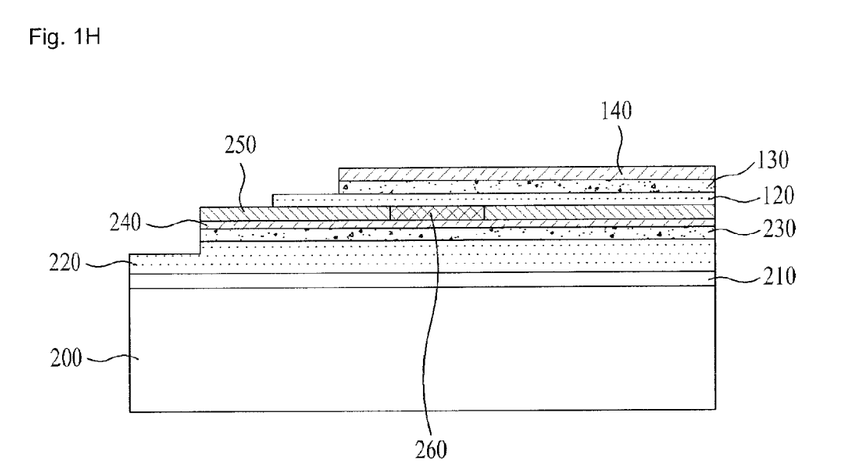

A structure in which two nitride semiconductors are connected under the condition that the connection layer 250 is interposed therebetween may be formed by the above-described method, and, in FIG. 1H, electrodes are formed. Here, the electrodes may be formed after MESA etching through reactive ion etching (RIE).

That is, MESA etching is performed up to parts of the second conductivity-type semiconductor layers 140 and 240 and the first conductivity-type semiconductor layers 120 and 220, thereby assuring spaces in which the electrodes will be formed.

When the MESA etching process has been completed, the first conductivity-type semiconductor layer 220 and the second conductivity-type semiconductor layer 240 of the second nitride semiconductor and the first conductivity-type semiconductor layer 120 of the first nitride semiconductor are exposed, in FIG. 1H.

Here, in order to expose the above three layers, the MESA etching process needs to be performed three times. Further, the second conductivity-type semiconductor layer 140 of the first nitride semiconductor is the uppermost layer, and thus may be exposed.

Figure 2A:
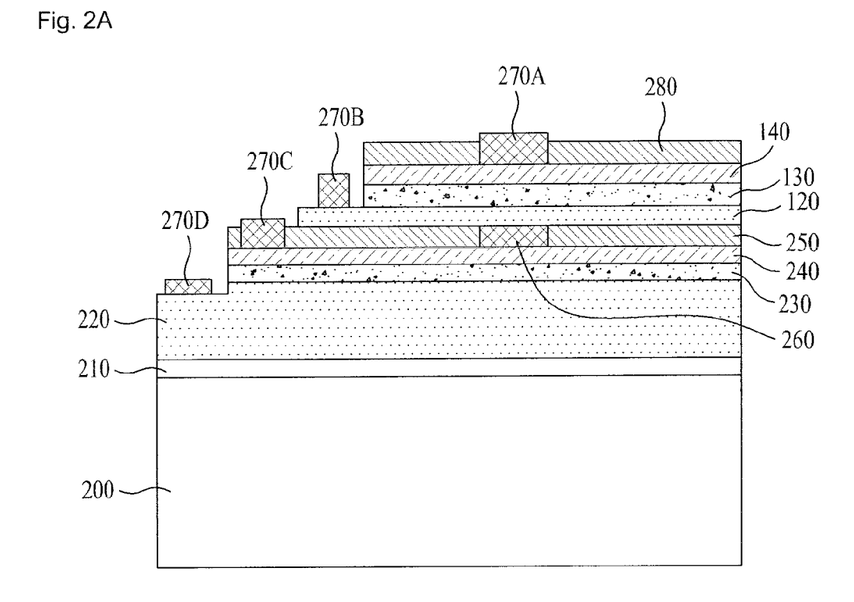
FIGS. 2A and 2B are views illustrating a light emitting device in accordance with one embodiment of the present embodiment.
Figure 2B:
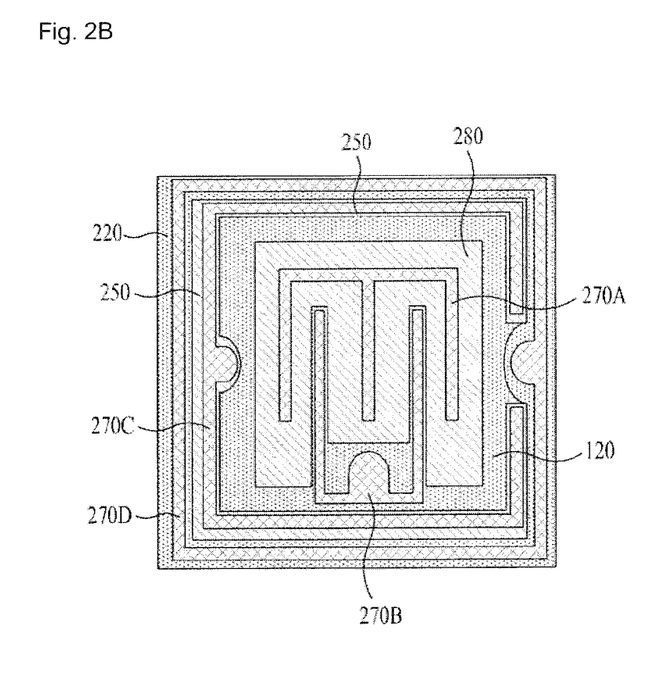

After the MESA etching process has been completed, the electrodes are formed, thereby forming a light emitting device having a horizontal structure, in FIGS. 2A and 2B.

In FIG. 2A, an N-type electrode 270D is formed on the first conductivity-type semiconductor layer 220 of the second nitride semiconductor, and a P-type electrode 270C is formed on the second conductivity-type semiconductor layer 220 of the second nitride semiconductor.

An N-type electrode 270B is formed on the first conductivity-type semiconductor layer 120 of the first nitride semiconductor, and a P-type electrode 270A is formed on the second conductivity-type semiconductor layer 140 of the first nitride semiconductor. Here, a transparent electrode layer 280 may be formed on the second conductivity-type semiconductor layer 140.

The above electrodes may be formed of at least one metal selected from among the group consisting of chrome (Cr), nickel (Ni), gold (Au), aluminum (Al), titanium (Ti) and platinum (Pt), or alloys thereof.

Further, the transparent electrode layer 280 may include a metal thin film or a metal oxide, and in this case, the transparent electrode layer 280 may effectively transmit light emitted from the active layer 130.

FIG. 2B is an elevation view of the light emitting device of FIG. 2A. In FIG. 2B, the four electrodes 270A, 270B, 270C and 270D are formed on the respective semiconductor layers.

The above-described light emitting device may be driven by AC power. Here, the electrode 270A and the electrode 270D are connected to a common electrode or terminal, and the electrode 270C and the electrode 270B are connected to another common electrode or terminal.

Figure 3A:
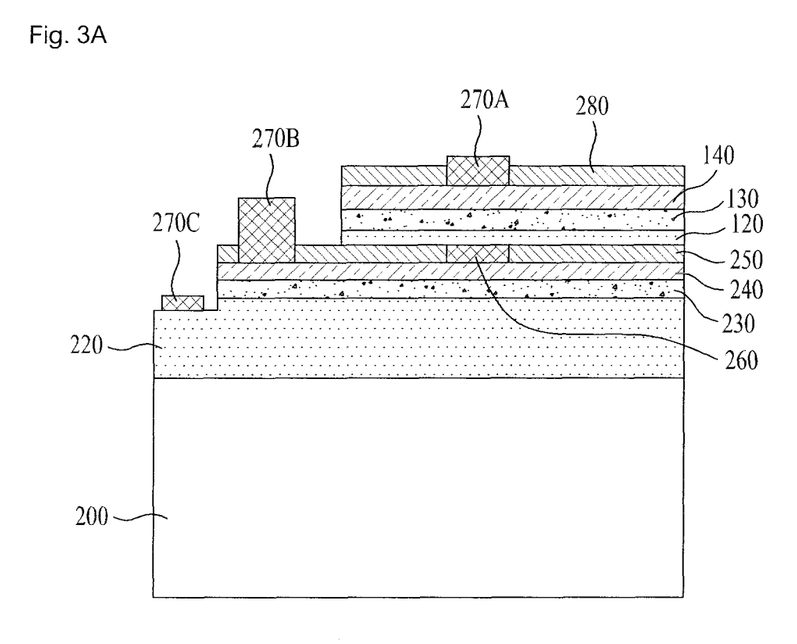
FIGS. 3A and 3B are views illustrating a light emitting device in accordance with another embodiment of the present embodiment.
Figure 3B:
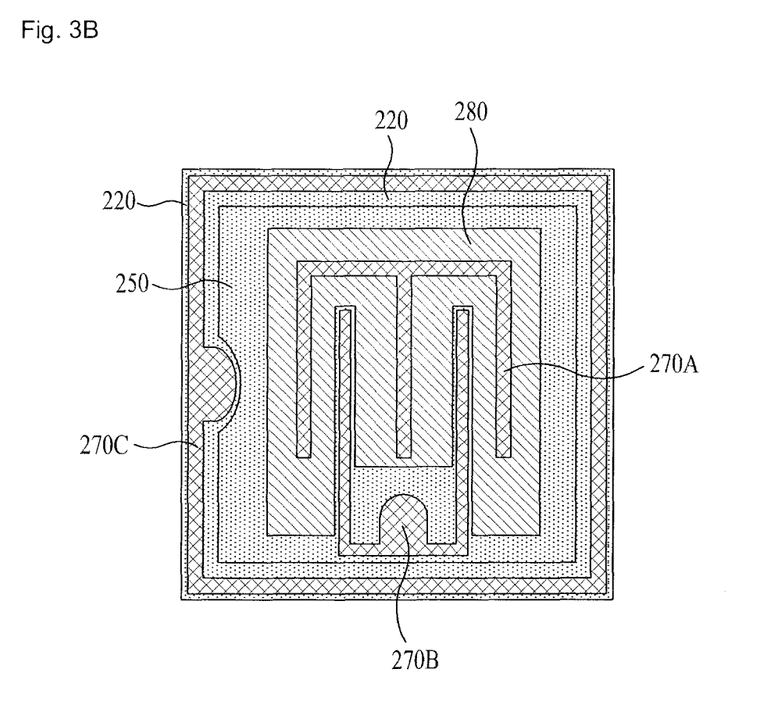

FIGS. 3A and 3B are views illustrating a light emitting device in accordance with another embodiment.

With reference to FIGS. 3A and 3B, three electrodes may be formed on a light emitting device including two nitride semiconductors. That is, after the process shown in FIG. 1G, instead of performing the MESA etching process three times, the MESA etching process is performed twice in order to expose two layers.

In FIG. 3A, an N-type electrode 270C is formed on a first conductivity-type semiconductor layer 220 of the second nitride semiconductor. Further, an N-type electrode 270B is formed on a second conductivity-type semiconductor layer 240 of the second nitride semiconductor, and a P-type electrode 270A is formed on a second conductivity-type semiconductor layer 140 of the first nitride semiconductor.

In the same manner as the former embodiment shown in FIGS. 2A and 2B, a transparent electrode layer 280 may be formed on the second conductivity-type semiconductor layer 140. Further, compositions of the electrodes are the same as those of the former embodiment shown in FIGS. 2A and 2B.

FIG. 3B is an elevation view of the light emitting device of FIG. 3A. In FIG. 3B, the three electrodes 270A, 270B and 270C are formed on the respective semiconductor layers.

Further, the above-described light emitting device may be driven by AC power. Here, the electrode 270A and the electrode 270C are connected to a common electrode or terminal, and the electrode 270B is connected to another electrode or terminal.

The above-described light emitting devices in accordance with the embodiments may be connected to two electrode terminals and be driven by AC power. That is, each of the light emitting devices may be driven by applying currents in different directions, i.e., AC currents to the two active layers having the MQW structure. Further, each of the light emitting devices in accordance with the embodiments includes the two active layers having the MQW structure, and thus light/energy emitted from each of the light emitting devices may be increased.

Figure 4:
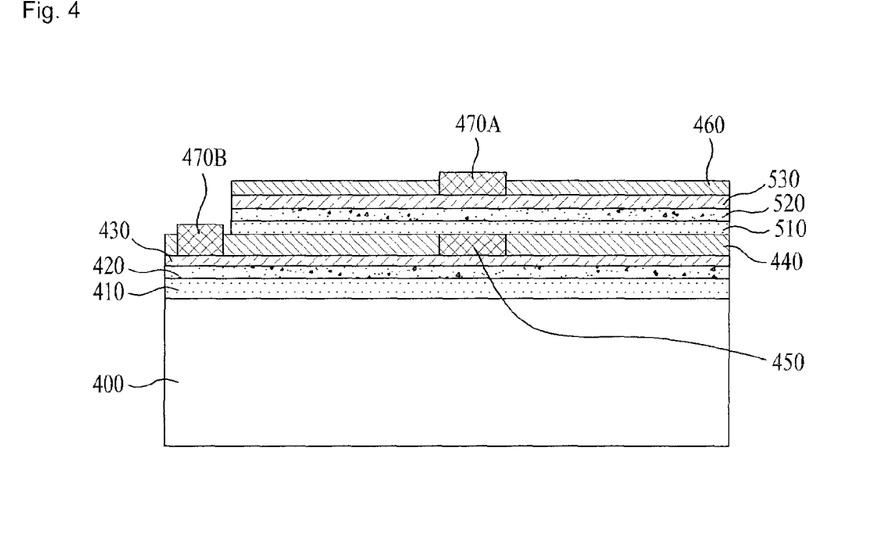
FIG. 4 is a view illustrating a light emitting device in accordance with yet another embodiment of the present embodiment.

FIG. 4 is a view illustrating a light emitting device in accordance with yet another embodiment.

With reference to FIG. 4, a first nitride semiconductor including a first conductivity-type semiconductor layer 410, an active layer 420 and a second conductivity-type semiconductor layer 430 is formed on a conductive substrate 400, and a current blocking layer 450 and a connection layer 440 are formed on the second conductivity-type semiconductor layer 430.

The first nitride semiconductor is connected to a second nitride semiconductor including a first conductivity-type semiconductor layer 510, an active layer 520 and a second conductivity-type semiconductor layer 530 through the connection layer 440.

Further, a transparent electrode layer 460 may be formed on the second conductivity-type semiconductor layer 530. Compositions of the respective layers are the same as those of the former embodiments.

The conductive substrate 400 may be a base substrate formed of copper (Cu), gold (Au), nickel (Ni), molybdenum (Mo), copper-tungsten (Cu—W) and includes single or multiple layers. Further, the conductive substrate 400 may be omitted, or may be disposed in a conductive sheet type.

Further, removal of a support substrate on which the second nitride semiconductor is stacked by Laser Lift-Off is the same as in the former embodiments.

In this embodiment shown in FIG. 4, by performing the MESA etching process once, the second conductivity-type semiconductor layer 430 of the first nitride semiconductor is exposed, and an electrode 470B is formed on the exposed second conductivity-type semiconductor layer 430.

Then, power is connected to two electrodes 470A and 470B and the conductive substrate 400. The electrode 470A and the conductive substrate 400 may be connected to a common electrode or terminal, and the electrode 470B may be connected to another electrode or terminal.

Therefore, the light emitting device in accordance with the embodiment of FIG. 4 may be connected to two electrode terminals and be driven by AC power. Further, the light emitting device in accordance with the embodiment of FIG. 4 includes the two active layers having the MQW structure, and thus light/energy emitted from the light emitting device may be increased.

Figure 5:
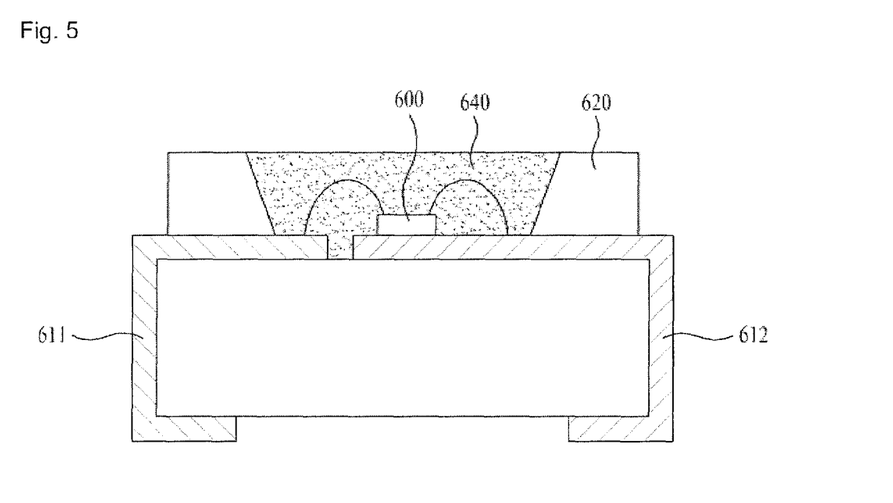
FIG. 5 is a view illustrating a light emitting device package in accordance with one embodiment of the present embodiment.

FIG. 5 is a view illustrating a light emitting device package in accordance with one embodiment. Hereinafter, with reference to FIG. 5, the light emitting device package in accordance with this embodiment will be described.

In FIG. 5, the light emitting device package in accordance with this embodiment includes a package body 620, a first electrode layer 611 and a second electrode layer 612 installed on the package body 620, a light emitting device 600 installed on the package body 620 and electrically connected to the first electrode layer 611 and the second electrode layer 612, and a filing material 640 surrounding the light emitting device 600.

The package body 620 may be made of a material, such as silicon, a synthetic resin or a metal. The package body 620 includes inclined planes around the light emitting device 600, thus increasing light extraction efficiency.

The first electrode layer 611 and the second electrode layer 612 are electrically isolated from each other, and provide power to the light emitting device 600. Further, the first electrode layer 611 and the second electrode layer 612 may serve to reflect light emitted from the light emitting device 600 to increase light efficiency, and to discharge heat generated by the light emitting device 600 to the outside.

The light emitting device 600 may be installed on the package body 620, or be installed on the first electrode layer 611 or the second electrode layer 612.

The light emitting device 600 may be electrically connected to the first electrode layer 611 and the second electrode layer 612 by one method out of a wire-bonding method, a flip chip-bonding method or a die-bonding method.

The filling material 640 may surround the light emitting device 600 to protect the light emitting device 600. Further, the filling material 640 may include a phosphor, thus varying a wavelength of light emitted from the light emitting device 600.

The above light emitting device package may include at least one light emitting device or plural light emitting devices from among the light emitting devices in accordance with the former embodiments, but is not limited thereto.

An array of a plurality of light emitting device packages in accordance with this embodiment may be mounted on a substrate, and optical members, such as a light guide panel, a prism sheet, a diffusion sheet, etc., may be disposed on a optical path of the light emitting device packages. The light emitting device packages, the substrate and the optical members may function as a light unit. In accordance with another embodiment, the light emitting devices or the light emitting device package in accordance with the above-described embodiments may constitute a display device, an indicating device or a lighting system, and, for example, the lighting system may include a lamp or a streetlight.

Figure 6:
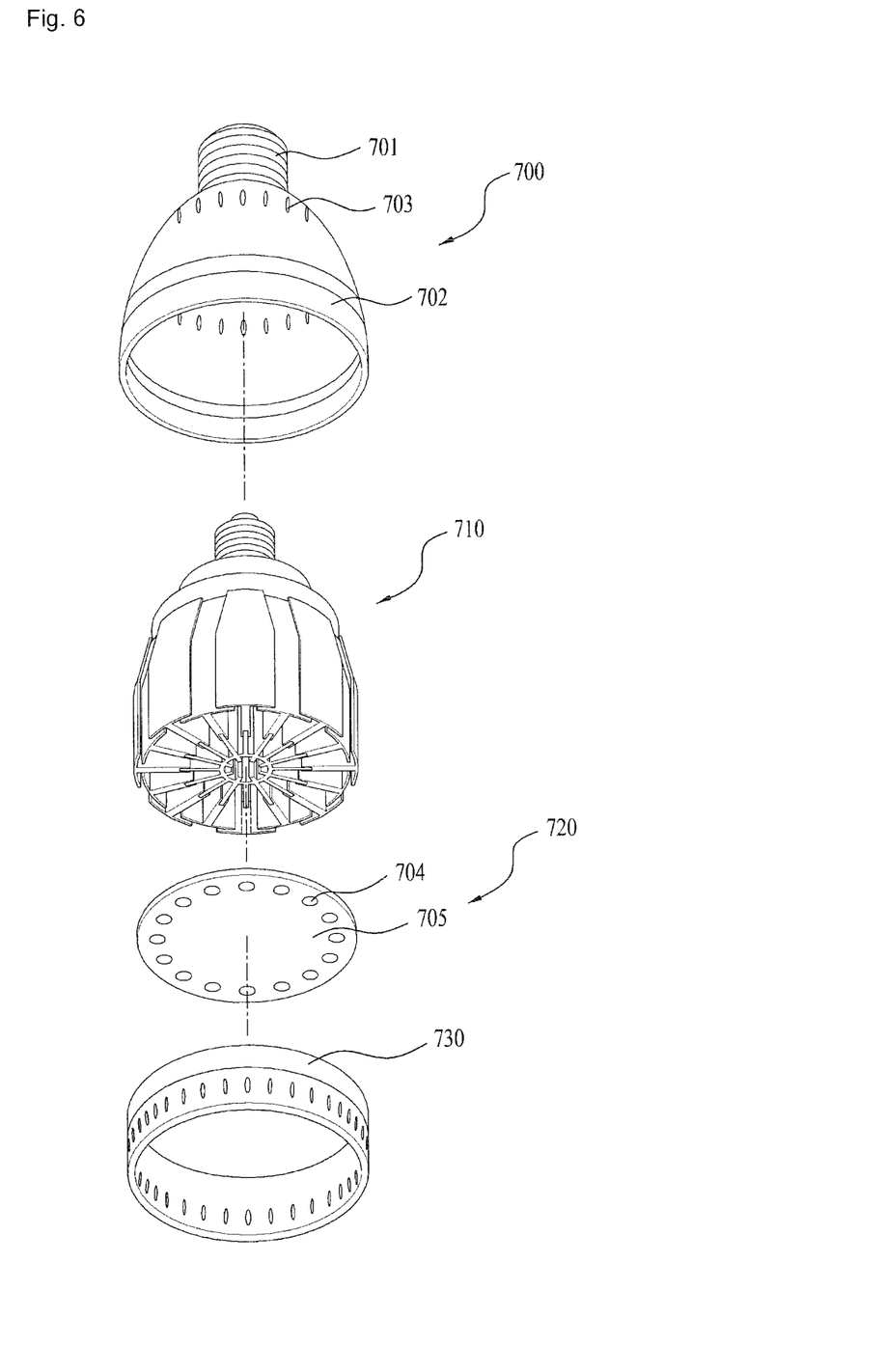
FIG. 6 is an exploded perspective view of a lighting apparatus including light emitting device packages in accordance with one embodiment of the present embodiment.

FIG. 6 is an exploded perspective view of a lighting apparatus including light emitting device packages in accordance with one embodiment.

The lighting apparatus in accordance with this embodiment includes a light source 720 to project light, a housing 700 in which the light source 720 is installed, a heat dissipation unit 710 to dissipate heat generated by the light source 720, and a holder 730 to connect the light source 720 and the heat dissipation unit 710 to the housing 700.

The housing 700 includes a socket connector 701 connected to an electrical socket (not shown) and a body 702 connected to the socket connector 701 and accommodating the light source 720. One air flow hole 703 may be formed through the body 702.

In this embodiment, a plurality of air flow holes 703 is disposed on the body 702 of the housing 700. One air flow hole 703 may be formed, or plural air flow holes 703 may be disposed in a radial shape, in FIG. 6, or various other shapes.

The light source 720 includes a plurality of light emitting device packages 704 on a substrate 705. Here, the substrate 705 may have a shape which is capable of being inserted into an opening of the housing 700, and be formed of a material having high thermal conductivity so as to transfer heat to the heat dissipation unit 710, as described later.

The holder 730 is disposed under the light source 720. The holder 730 may include a frame and air flow holes. Further, although not shown in FIG. 6, optical members may be disposed under the light source 720 so as to diffuse, scatter or converge light emitted from the light emitting device packages 704 of the light source 720.

Figure 7A:
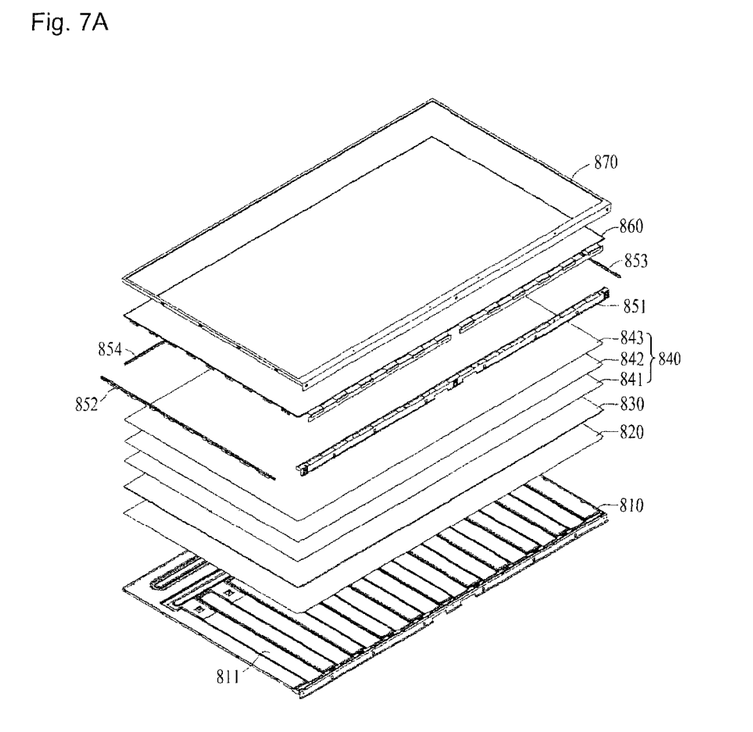
FIGS. 7A and 7B are views illustrating a backlight including light emitting device packages in accordance with one embodiment of the present embodiment.
Figure 7B:
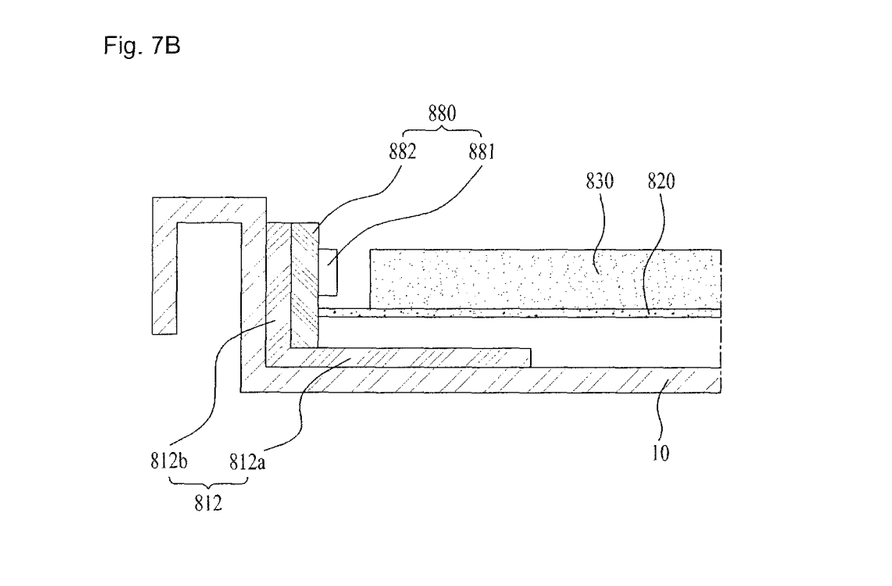

FIGS. 7A and 7B are views illustrating a backlight including light emitting device packages in accordance with one embodiment.

In FIGS. 7A and 7B, the backlight includes a bottom cover 810, a light emitting device package module (not shown) disposed at one side of the inside of the bottom cover 810, a reflective plate 820 disposed on the front surface of the bottom cover 810, a light guide panel 830 disposed in front of the reflective plate 820 to guide light emitted from the light emitting device package module to the front part of a display device, and optical members 840 disposed in front of the light guide panel 830. The display device including the backlight may further include, in addition to the above components, a liquid crystal display panel 860 disposed in front of the optical members 840, a top cover 870 disposed in front of the liquid crystal display panel 860, and fixing members 850 disposed between the bottom cover 810 and the top cover 870 to fix the bottom cover 810 and the top cover 870 together.

The light guide panel 830 serves to guide light emitted from the light emitting device package module (not shown) so as to convert the light into surface light. The reflective plate 820 disposed at the rear of the light guide panel 830 serves to reflect light emitted from the light emitting device package module (not shown) toward the light guide panel 830 so as to improve light efficiency.

The reflective plate 820 may be disposed as a separate component, in FIGS. 7A and 7B, or be disposed by coating the rear surface of the light guide panel 830 or the front surface of the bottom cover 810 with a material having high reflectivity.

Here, the reflective plate 820 may be formed of a material having high reflectivity and usable as an ultra-thin type, such as polyethylene terephthalate (PET).

Further, the light guide panel 830 scatters light emitted from the light emitting device package module so as to uniformly distribute the light throughout the entirety of a screen of the liquid crystal display device. Therefore, the light guide panel 830 is formed of a material having a high index of refraction and high transmittance, such as polymethylmethacrylate (PMMA), polycarbonate (PC) or polyethylene (PE).

The optical members 840 disposed on the light guide panel 830 diffuse light emitted from the light guide panel 830 by a designated angle. The optical members 840 enable light guided by the light guide panel 830 to be uniformly irradiated toward the liquid crystal display panel 860.

As the optical members 840, optical sheets, such as a diffusion sheet, a prism sheet and a protection sheet, may be selectively stacked, or a micro-lens array may be used. Here, a plurality of optical sheets may be used, and the optical sheets may be formed of a transparent resin, such as acrylic resin, polyurethane resin or silicon resin. Further, the prism sheet may include a phosphor sheet, as described above.

The liquid crystal display panel 860 may be disposed on the front surface of the optical members 840. Here, it will be apparent that, instead of the liquid crystal display panel 860, other kinds of display devices requiring a light source may be disposed.

FIG. 7B is a cross-sectional view of a light source part of the backlight.

In FIG. 7B, the reflective plate 820 is mounted on the bottom cover 810, and the light guide panel 830 is mounted on the reflective plate 820. Thereby, the reflective plate 820 may directly contact a heat dissipation member (not shown).

Printed circuit boards 881 to which light emitting device packages 882 are fixed may be bonded to a bracket 812. Here, the bracket 812 may be formed of a material having high thermal conductivity so as to discharge heat as well as to fix the light emitting device packages 882, and, although not shown in the drawings, heat pads may be disposed between the bracket 812 and the light emitting device packages 882 so as to facilitate heat transfer.

Further, the bracket 812 is disposed in an L shape, in FIG. 7B, a horizontal part 812a of the bracket 812 is supported by the bottom cover 810, and a vertical part 812a of the bracket 812 fixes the printed circuit boards 881.

As apparent from the above description, a light emitting device, a method of fabricating the same and a light emitting device package in accordance with one embodiment may be driven using AC power.

It will be apparent to those skilled in the art that various modifications and variations can be made in the present embodiment without departing from the spirit or scope of the embodiments. Thus, it is intended that the present embodiment covers the modifications and variations of this embodiment provided they come within the scope of the appended claims and their equivalents.

What is claimed is:

1. A light emitting device comprising:
   a first nitride semiconductor and a second nitride semiconductor, each of which includes a first conductivity-type semiconductor layer, a second conductivity-type semiconductor layer and an active layer disposed between the first conductivity-type semiconductor layer and the second conductivity-type semiconductor layer; and
   a connection layer formed between the second conductivity-type semiconductor layer of the second nitride semiconductor and the first conductivity-type semiconductor layer of the first nitride semiconductor,
   wherein the first nitride semiconductor and the second nitride semiconductor are connected by the connection layer, and the light emitting device further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor.

2. The light emitting device according to claim 1, wherein at least one of the electrodes is formed on an exposed part of the first conductivity-type semiconductor layer of the first nitride semiconductor.

3. The light emitting device according to claim 2, wherein the electrode formed on the part of the first conductivity-type semiconductor layer of the first nitride semiconductor and the electrode formed on at least the part of the second conductivity-type semiconductor layer of the second nitride semiconductor are connected to a first electrode.

4. The light emitting device according to claim 2, wherein the electrode formed on at least the part of the second conductivity-type semiconductor layer of the first nitride semiconductor and the electrode formed on at least the part of the first conductivity-type semiconductor layer of the second nitride semiconductor are connected to a second electrode.

5. The light emitting device of claim 2, wherein the electrodes formed on the second conductivity-type semiconductor layer of the first nitride semiconductor, the first conductivity-type semiconductor layer of the second nitride semiconductor, the second conductivity-type semiconductor layer of the second nitride semiconductor and the first conductivity-type semiconductor layer of the first nitride semiconductor are different electrodes.

6. The light emitting device according to claim 1, further comprising a current blocking layer formed between the second conductivity-type semiconductor layer of the second nitride semiconductor and the first conductivity-type semiconductor layer of the first nitride semiconductor.

7. The light emitting device according to claim 6, wherein the current blocking layer is formed of a metal or an insulating material.

8. The light emitting device according to claim 6, wherein at least one of the electrodes is formed on an exposed part of the first conductivity-type semiconductor layer of the first nitride semiconductor and the current blocking layer is formed corresponding to the electrode.

9. The light emitting device of claim 8, wherein the electrodes formed on the second conductivity-type semiconductor layer of the first nitride semiconductor, the first conductivity-type semiconductor layer of the second nitride semiconductor, the second conductivity-type semiconductor layer of the second nitride semiconductor and the first conductivity-type semiconductor layer of the first nitride semiconductor are different electrodes.

10. The light emitting device according to claim 6, wherein the current blocking layer is formed within the connection layer.

11. The light emitting device according to claim 1, further comprising a transparent electrode layer fondled on the first conductivity-type semiconductor layer of the first nitride semiconductor.

12. The light emitting device according to claim 1, wherein the electrode formed on at least the part of the second conductivity-type semiconductor layer of, the first nitride semiconductor and the electrode formed on at least the part of the first conductivity-type semiconductor layer of the second nitride semiconductor are connected to a first electrode.

13. The light emitting device according to claim 12, wherein the electrode formed on at least the part of the second conductivity-type semiconductor layer of the second nitride semiconductor is connected to a second electrode.

14. A light emitting device package comprising:
a package body;
a first electrode layer and a second electrode layer disposed on the package body and electrically isolated from each other; and
a light emitting device electrically connected to the first electrode layer and the second electrode layer,
wherein the light emitting device includes a first nitride semiconductor and a second nitride semiconductor, each of which includes a first conductivity-type semiconductor layer, a second conductivity-type semiconductor layer and an active layer disposed between the first conductivity-type semiconductor layer and the second conductivity-type semiconductor layer, and a connection layer formed between the second conductivity-type semiconductor layer of the second nitride semiconductor and the first conductivity-type semiconductor layer of the first nitride semiconductor,
wherein the first nitride semiconductor and the second nitride semiconductor are connected by the connection layer, and the light emitting device package further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor.

15. The light emitting device package according to claim 14, further comprising a current blocking layer formed between the second conductivity-type semiconductor layer of the second nitride semiconductor and the first conductivity-type semiconductor layer of the first nitride semiconductor.

16. The light emitting device package according to claim 15, wherein the current blocking layer is formed of a metal or an insulating material.

17. The light emitting device package according to claim 15, wherein at least one of the electrodes is formed on an exposed part of the first conductivity-type semiconductor layer of the first nitride semiconductor and wherein the current blocking layer is formed corresponding to the electrode.

18. The light emitting device of claim 17, wherein the electrodes formed on the second conductivity-type semiconductor layer of the first nitride semiconductor, the first conductivity-type semiconductor layer of the second nitride semiconductor, the second conductivity-type semiconductor layer of the second nitride semiconductor and the first conductivity-type semiconductor layer of the first nitride semiconductor are different electrodes.

19. The light emitting device package according to claim 15, wherein the current blocking layer is formed within the connection layer.

20. A lighting system comprising:
light emitting device packages, each of which includes at least one light emitting device;
a circuit board electrically connected to the light emitting device packages;
a substrate to support the light emitting device packages and the circuit board; and
optical members to transmit light emitted from the light emitting device packages,
wherein the at least one light emitting device includes a first nitride semiconductor and a second nitride semiconductor, each of which includes a first conductivity-type semiconductor layer, a second conductivity-type semiconductor layer and an active layer disposed between the first conductivity-type semiconductor layer and the second conductivity-type semiconductor layer, and a connection layer formed between the second conductivity-type semiconductor layer of the second nitride semiconductor and the first conductivity-type semiconductor layer of the first nitride semiconductor,
wherein the first nitride semiconductor and the second nitride semiconductor are connected by the connection layer, and the lighting system further comprises electrodes formed on at least a part of the second conductivity-type semiconductor layer of the first nitride semiconductor, at least a part of the first conductivity-type semiconductor layer of the second nitride semiconductor, and at least a part of the second conductivity-type semiconductor layer of the second nitride semiconductor.

21. The lighting system according to claim 20, further comprising a current blocking layer formed between the second conductivity-type semiconductor layer of the second nitride semiconductor and the first conductivity-type semiconductor layer of the first nitride semiconductor.

22. The lighting system according to claim 21, wherein the electrode formed on an exposed part of the first conductivity-type semiconductor layer of the first nitride semiconductor and the current blocking layer is formed corresponding to the electrode.

23. The lighting system according to claim 21, wherein the current blocking layer is formed within the connection layer.

* * * * *